United States Patent
Carre et al.

(10) Patent No.: US 6,551,650 B1
(45) Date of Patent: Apr. 22, 2003

(54) DIP FORMATION OF FLIP-CHIP SOLDER BUMPS

(75) Inventors: Alain R. Carre, Le Chatelet-en-Brie (FR); Jurriaan Gerretsen, Samois-sur-Seine (FR)

(73) Assignee: Corning Incorporated, Corning, NY (US)

( * ) Notice: Subject to any disclaimer, the term of this patent is extended or adjusted under 35 U.S.C. 154(b) by 87 days.

(21) Appl. No.: 09/710,521

(22) Filed: Nov. 9, 2000

(30) Foreign Application Priority Data

Nov. 9, 1999 (EP) .............................................. 99402793

(51) Int. Cl.⁷ ............................. B05D 5/12; B23K 31/02
(52) U.S. Cl. .......................... 427/58; 427/98; 427/433; 427/256; 228/180.1; 228/259; 228/180.22
(58) Field of Search ........................... 427/58, 98, 123, 427/256, 433, 436; 228/214, 259, 180.1, 180.22

(56) References Cited

U.S. PATENT DOCUMENTS

| | | | |
|---|---|---|---|
| 3,261,713 A | 7/1966 | Groten | |
| 5,028,454 A | 7/1991 | Lytle et al. | 427/123 |
| 5,218,759 A | 6/1993 | Juskey et al. | 29/840 |
| 5,397,383 A | 3/1995 | Wilczek | 106/1.11 |
| 5,415,679 A | 5/1995 | Wallace | 75/331 |
| 5,499,312 A | 3/1996 | Hahn et al. | 385/91 |
| 5,515,604 A | 5/1996 | Horine et al. | 29/830 |
| 5,534,442 A | 7/1996 | Parker et al. | 437/2 |
| 5,535,936 A | 7/1996 | Chong et al. | 228/175 |
| 5,661,831 A | 8/1997 | Sasaki et al. | 385/49 |
| 5,783,866 A | 7/1998 | Lee et al. | 257/780 |
| 5,795,619 A * | 8/1998 | Lin et al. | 427/123 |
| 5,796,714 A | 8/1998 | Chino et al. | 372/50 |
| 5,814,401 A | 9/1998 | Gamota et al. | 428/343 |
| 5,825,093 A | 10/1998 | Guo et al. | 257/782 |
| 5,831,832 A | 11/1998 | Gillette et al. | 361/760 |
| 5,838,069 A | 11/1998 | Itai et al. | 257/766 |
| 5,894,166 A | 4/1999 | Surridge | 257/675 |
| 6,070,788 A * | 6/2000 | Zakel | 228/214 |
| 6,085,968 A | 7/2000 | Swindlehurst et al. | 228/254 |

FOREIGN PATENT DOCUMENTS

| | | |
|---|---|---|
| EP | 0337149 | 3/1999 |
| JP | 57079649 | 5/1982 |
| JP | 02002132 | 1/1990 |
| JP | 09148333 | 6/1997 |
| WO | 08337 * | 3/1996 |

OTHER PUBLICATIONS

*Application of Electroless Nickel Plating in the Semiconductor Microcircuit Industry,* K. Wong, K. Chi, A. Rangappan, Plating and Surface Finishing, p. 70–76, Jul. 1988.

*Drop Motion on an Inclined Plane and Evaluation of Hydrophobic Treatments to Glass,* A. Carre, M.E.R. Shanahan, J. Adhesion, 1995, vol. 49, pp. 177–185.

*Optical coupling modeling and passive alignment techniques for parallel optoelectronic interfaces,* J.S. Sutherland, PhD Thesis, Cornell University, 1997.

* cited by examiner

Primary Examiner—Brian K. Talbot
(74) Attorney, Agent, or Firm—Juliana Agon

(57) ABSTRACT

A process for fabricating a solder bump (113) includes providing an inorganic de-wetting substrate (102). In order to form a composite substrate (20), having the desired wetting/dewetting composition, a wetting metal is first applied on the inorganic de-wetting substrate to create at least one wetting metal pad (52). The composite substrate (20) is then dipped or otherwise immersed into a reservoir of liquid solder (106). Next, the composite substrate (20) is redrawn (116), or otherwise removed, from the liquid solder to form solder bumps (113) on the at least one metal wetting pad (52).

20 Claims, 3 Drawing Sheets

DIP FORMATION OF FLIP-CHIP SOLDER BUMPS

BACKGROUND OF THE INVENTION

1. Field of the Invention

The present invention relates generally to flip-chip technology and particularly to coupling optoelectronic devices using solder bumps in flip-chip technology.

2. Technical Background

Manufacturers in the consumer electronics, telecommunications, engineering industries commonly use flip-chip technology. Flip-chip technology is starting to be used in the hybrid integration of optoelectronic devices to connect, align, and bear or otherwise support active and passive devices. Laser diode array and laser driver chips used in a transmitter module are examples of active devices. An optical star coupler, multiplexer chip, and fibers are examples of passive devices.

For example and according to the "C4" IBM process (see for example "Controlled Collapse Reflow Chip Joining", L. F. Miller, IBM Journal of Research and Development, 13, 1969), flip-chip technology involves fabricating a lead-tin Pb—Sn (40/60) solder bump generally on copper/aluminum pads located on a wafer and surrounded by a silica top layer. Silica is important because it is a dewetting surface for the solder. Therefore, the lead-tin bump stays confined on the copper/aluminum-wet pad.

Various processes and materials have been developed but the bump structure is for example composed of two main coatings on the copper/aluminum pad (Cu/Al).

First, an under bump plating coating is composed for example of chromium (Cr), copper (Cu) layers, or a combination layer of Cr/Cu. Second, the solder structure is composed of copper (Cu) and tin-lead.

The metal plating introduced between the Al conductive circuit (Al conductive pads) and the solder is an essential factor determining the reliability of the solder bump. The under-bump metallurgy, made by sputtering or evaporation, consists of a series of metal layers providing adhesion to the Al pad and limiting inter-diffusion between the bump metal and the pad. Semi-conductor manufacturers such as IBM initially developed the bumping technology in the seventies. The IBM process, considered as a standard in literature, consists of making a bump structure on aluminum pads.

The classical process for forming solder bumps is based on photolithography and involves the following steps: a) patterning aluminum conductive pads that are surrounded by silica on a silicon mother-board; b) deposition of the under bump metallurgy by sputtering or evaporation; c)depositing, patterning and developing a thick photo-resist; d) electroplating Cu pads and Sn/Pb solder bumps; e) stripping the resist and wet etching the base; and f) reflowing the Sn/Pb pins to form drops.

The wet pads formed in this manner usually have a diameter of 50 $\mu$m in diameter and the height of the solder drop is about 30 $\mu$m.

A recent trend in Flip-Chip technology consists of depositing gold/tin (Au/Sn) (80/20) solder bumps on Ti/Pt/Au pads. As the complexity of interconnection grows, there is a need for an easier, reliable, and practical process to improve the formation of solder bumps that provide satisfactory alignment and bearing properties.

SUMMARY OF THE INVENTION

One aspect of the present invention is a process for fabricating a solder bump on an inorganic de-wetting substrate by applying a wetting metal to create at least one wetting metal pad on the inorganic de-wetting substrate to form a composite substrate. The composite substrate is then dipped into a liquid solder and removed to form solder bumps on the at least one metal wetting pad.

In another aspect, the present invention includes the formation of wetting pads by printing.

Dipping of a wetting/dewetting composite substrate into liquid solder to form solder balls suitable for flip-chip bonding advantageously minimizes process steps. The redrawing of the dipped wetting/dewetting composite substrate results in solder balls having sufficient bearing capabilities. The printing or other formation of wetting pads, the dip/draw of metal drops and the desired bearing effect obtained with these drops provide a simple, fast, reliable and low cost alternative approach, when compared with the current process based on photolithography.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

DETAILED DESCRIPTION OF THE PREFERRED EMBODIMENTS

Figure 1:
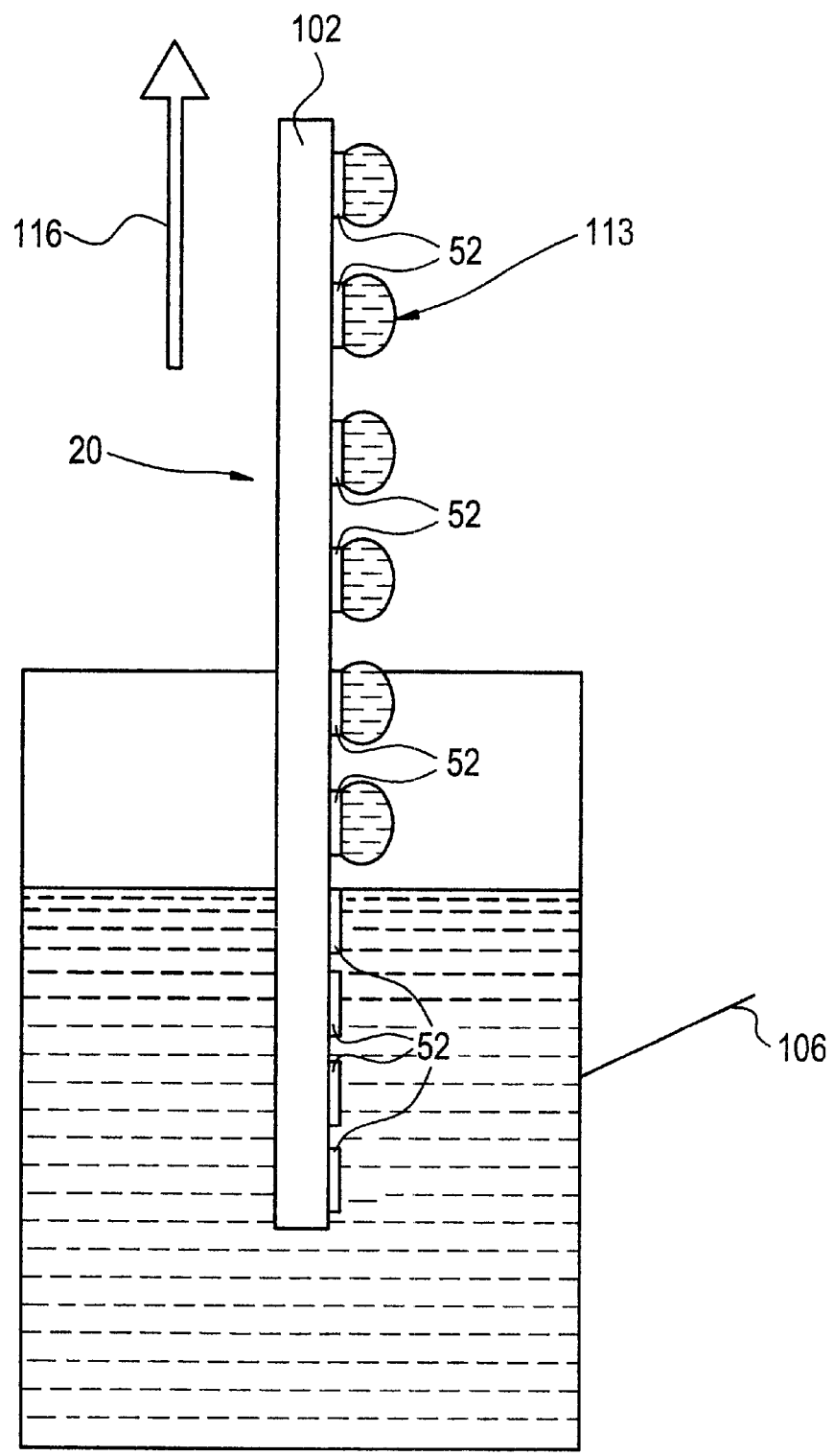
FIG. 1 is a side representation of the dipping process, in accordance with the present invention.

Reference will now be made in detail to the present preferred embodiments of the invention, examples of which are illustrated in the accompanying drawings. Wherever possible, the same reference numbers will be used throughout the drawings to refer to the same or like parts. An exemplary embodiment of a wetting/dewetting composite substrate used in the solder ball dipping process of the present invention is shown in FIG. 1, and is designated generally throughout by reference numeral 20.

In general, the present invention teaches a new and easier process to rapidly form solder bumps on a composite surface having a dewetting background on which are deposited wetting pads. The dewetting background is composed of silica or of silicabased glass and the wetting pads are gold patches. According to the teachings of the inventive technique, a wetting/dewetting substrate is dipped in the liquid solder to form solder bumps used in the flip-chip technology.

Referring to FIG. 1, a process for fabricating solder bumps includes providing an inorganic de-wetting background 102. In order to form a composite substrate 20, having the desired wetting/dewetting composition, a wetting metal is first applied on the inorganic de-wetting background 102 to create wetting metal pads 52. The composite substrate 20 is then dipped or otherwise immersed into a reservoir of liquid solder 106. Next, the composite substrate 20 is redrawn, as indicated by the arrow 116, or otherwise removed, from the liquid solder to form solder bumps 113 on the metal wetting pads 52.

The de-wetting background 102 is formed from a substrate of suitable materials, such as silica, glass, silica/sillicon, alumina, or ceramics. The wetting/dewetting structure or composite substrate 20 can be produced by printing, sputtering, evaporation or other metal deposition processes. The wetting areas or pads 52 may be preferably created by printing, for example, from a dispersion of gold in a liquid medium. Other metals, such as copper or silver, are suitable for forming the wetting pads 52.

An important advantage of the present invention is that the solder drop bump formation does not require the entire complex and multiple-step processes of photolithography. When the wetting/dewetting structure is formed on the substrate 20 by the wetting metal pads 52 on the inorganic de-wetting background 102, a simple dip of the substrate 20 in the liquid solder bath 106 allows the formation of a series of solder droplets 113 having substantially the same size.

The invention describes a simple method of fabricating solder bumps by dipping. Forces, such as surface tension, from the wetting/dewetting substrate 20 and the liquid solder bumps provide horizontal and vertical alignment and positioning of the elements of a device. For photonic applications, it is important to be able to align optical components that have very tight tolerances and otherwise support or bear their weight.

Figure 2:
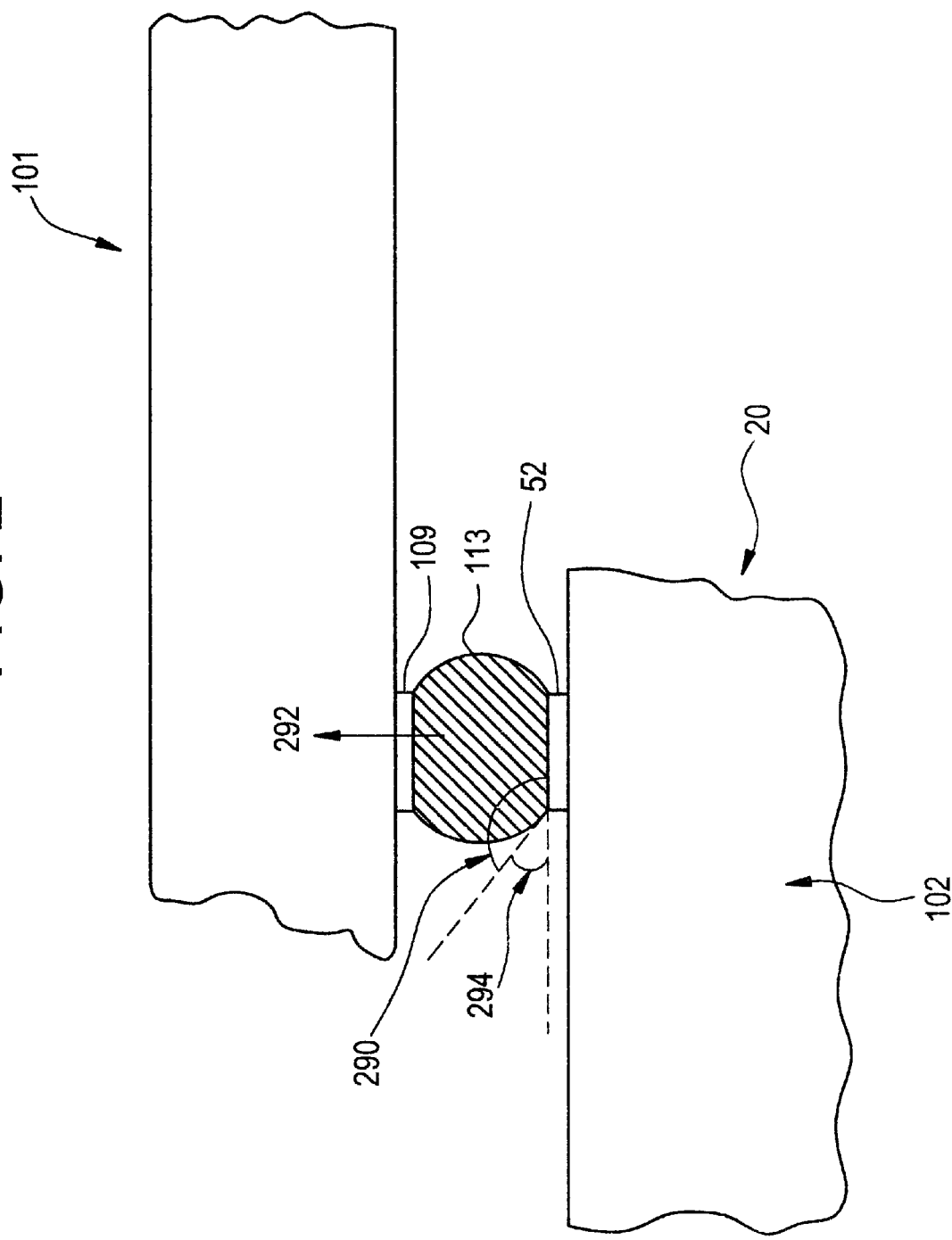
FIG. 2 is a representation of the bearing effect of the solder balls formed 113 from the process of FIG. 1, in accordance with the present invention.

Referring to FIG. 2, a composite substrate 20 that can be used directly as an optical component, such as a waveguide, or as a support for an optical component, is to be aligned with another optical component 101, such as a laser diode, located above the substrate 20 and having a corresponding solder pad 109 for mating with the wetting pad 52 of the composite substrate 20. Even though the preferred pad shape is circular, other shapes, such as squares are usable. On the substrate 20 having a composite surface made of wetting areas or pads 52 on a dewetting background, liquid droplets or solder balls 113 can be easily formed by simply dipping the substrate 20 into the liquid solder of FIG. 1. When the substrate 20 is redrawn from the liquid, the liquid solder or metal wets only the wetting areas 52. If the wetting areas 52 are sufficiently small, typically smaller in diameter than the capillary or Laplace length of the liquid solder (about 2 mm for liquid metal), droplets are spontaneously formed only on the wetting areas 52, as seen in FIG. 1, to result in easily and rapidly formed solder bumps used in flip-chip technology, as seen in the application of FIG. 2. The liquid used may be any liquid metal satisfying the desired wetting/dewetting criteria.

EXAMPLES

The invention will be further clarified by the following examples of liquid metal satisfying the desired wetting/dewetting criteria which are only intended to be exemplary of the invention.

Example 1

Figure 3:
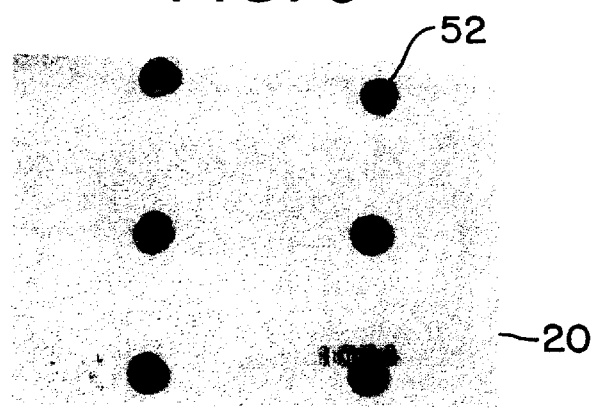
FIG. 3 is a top view of a dewetting glass slide printed with gold pads, as an example of the composite substrate 20 of FIG. 1, in accordance with the present invention.
Figure 4:
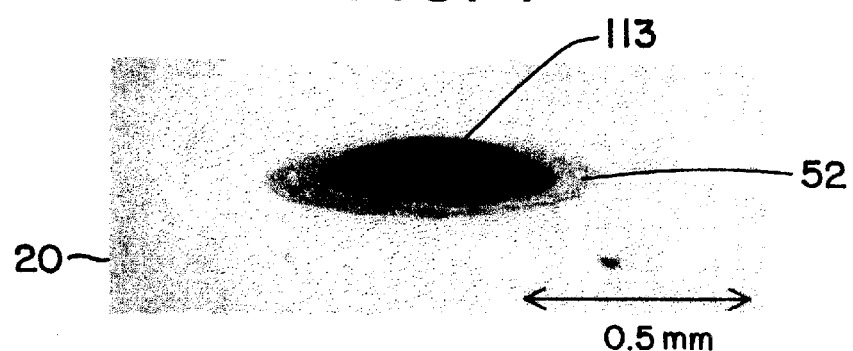
FIG. 4 is a profile of a mercury droplet formed on the gold wetting pad, as an example of a solder ball droplet 113 formed on the composite substrate 20 of FIG. 3, in accordance with the present invention.

The principle of the invention is demonstrated by using mercury as a model of liquid metal at room temperature. Referring to FIGS. 3 and 4, the composite substrate 20 was a soda-lime microscope slide partially coated by printing with gold pads 52 having a diameter of 500 $\mu$m. The printed slide was dipped into mercury and mercury droplets 113 were spontaneously formed when redrawn from the liquid metal.

On the soda-lime microscope slide 20, gold pads 52 were formed by typographic printing by using a pin plate. The pin plate was dipped into a gold dispersion and the drops were transferred on the slide by printing. Curing of the gold solution at 500° C. for a few hours led to the formation of solid gold pads 52 having a diameter of about 0.5 mm. FIG. 3 shows the resultant gold pads 52 deposited on the glass slide 20.

The slide 20 was then dipped into mercury at room temperature. Mercury, a liquid metal, was chosen as a model of solder, the surface tension of mercury (~485 mN.m$^{-1}$) being close to the surface tension of tin/lead solder (~500 mN.m$^{-1}$ at 350° C.). After being redrawn from mercury, multiple metal droplets 113 having a diameter of 0.5 mm were spontaneously formed on the slide 20. FIG. 4 illustrates the profile of one mercury droplet 113.

"The mercury droplets 113 exhibited a relatively flat profile, with a receding wetting angle 294,(refer to FIG. 2 for angle and bearing references) of 40 degrees. However, as the droplets have an advancing wetting angle 290 (or the contact angle of the solder on the pad) higher than ninety (90) degrees on glass, they are able to create a bearing effect 292. The ideal or optimum contact angle of the deformation of the solder bump from having an upper load applied is about one hundred and thirty five degrees from the dewetting background. This value from surface tension forces leads to the highest and strongest "spring" effect for alignment purposes. Such a desired bearing or supportive spring effect 292 was demonstrated by placing a glass cover slip 101 having a diameter of 12 mm and a mass of 0.04 g . . . ".

Figure 5:
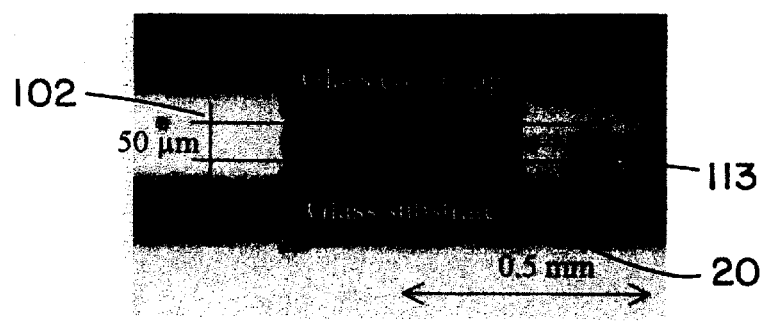
FIG. 5 is a profile of a squeezed mercury droplet 113 of FIG. 4 between two hard surfaces to demonstrate the bearing effect, in accordance with the present invention.

Supported by the sixteen mercury droplets 113, the cover slip 102 was lifted up 50 $\mu$m from the substrate 20 surface due to surface tension forces. FIG. 5 shows the bearing effect and the profile of mercury drop 113 supporting the glass cover slip 102 placed over the liquid metal droplets 113.

The series of droplets 113 supporting the glass cover slip 102 acted as a spring. This bearing effect was observed in applying a normal load to the cover slip 102, which reduced the 50-$\mu$m gap between the glass substrate 20 and the cover slip 102. When the load was released, the initial gap was restored.

Example 2

Tin/lead solder bumps were formed by dipping a silicon substrate bearing gold wetting pads, having a mm size, into the tin/lead solder melt. When redrawn, solder droplets were formed only on the gold pads. More specifically, the silicon substrate bearing gold pads having a square shape of 1 mm on each side was dipped into a tin/lead (60/40) solder at 350° C. After redrawing from the liquid solder, solder drops were obtained only on the wet gold pads.

In summary, the solder bumps drop formation, including the optional printing of wet gold pads on a de-wetting background to form the wetting/dewetting composite substrate, by dipping the wetting/dewetting substrate in liquid metal, is a simple, rapid and low cost technique.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A process for fabricating a solder bump having a desired shape profile, the process comprising the steps of:
   selecting a liquid solder having a capillary length;
   providing an inorganic de-wetting substrate;
   applying a wetting metal to create a plurality of wetting metal pads on the inorganic de-wetting substrate to form a composite substrate having a composite surface of the plurality of wetting metal pads surrounded by a de-wetting background, wherein each wetting metal pad has a dimension smaller than the capillary length;
   containing a reservoir of the liquid solder having a horizontal top flat surface of the liquid solder;
   vertically dipping the composite substrate into the reservoir of liquid solder for wetting the liquid solder onto the composite substrate such that the composite surface perpendicularly immerses pass the horizontal top flat surface of the liquid solder; and
   vertically removing the composite substrate from the liquid solder such that the composite surface is perpendicularly withdrawn pass the horizontal top flat surface of the liquid solder for the liquid solder to remain only on the plurality of wetting metal pads as a solder drop having the desired shape profile and not adhere to the de-wetting background to form a remaining plurality of corresponding solder bumps having the desired shape profile to provide a sufficient bearing effect on the plurality of wetting metal pads.

2. The process of claim 1 wherein the providing step comprises providing a silica substrate.

3. The process of claim 1 wherein the providing step comprises providing a glass substrate.

4. The process of claim 1 wherein the providing step comprises providing a silicon substrate.

5. The process of claim 1 wherein the providing step comprises providing a silica/silicon substrate having a composite of silica and silicon as the inorganic de-wetting material composition.

6. The process of claim 1 wherein the providing step comprises providing an alumina substrate.

7. The process of claim 1 wherein the providing step comprises providing a ceramic substrate.

8. The process of claim 1 wherein the applying step comprises applying gold.

9. The process of claim 1 wherein the applying step comprises applying copper.

10. The process of claim 1 wherein the applying step comprises applying silver.

11. A process for fabricating a solder bump having a desired shape profile, the process comprising the steps of:
    selecting a liquid solder having a capillary length;
    providing a substrate comprising a wetting pad on a de-wetting background on a composite surface of the substrate, the wetting pad having a dimension smaller than the capillary length;
    vertically dipping the substrate into the liquid solder such that the composite surface perpendicularly immerses pass a horizontal top flat surface of the liquid solder; and
    vertically redrawing the substrate from the horizontal top flat surface of the liquid solder such that the composite surface is perpendicularly withdrawn pass the horizontal top flat surface of the liquid solder for the liquid solder to remain only on the wetting pad as a solder drop having the desired shape profile and not adhere to the de-wetting background to form a resultant solder bump having the desired shape profile to provide a sufficient bearing effect.

12. The process of claim 10 wherein the providing step comprises typographically printing the wetting pad on a de-wetting substrate.

13. A method for fabricating a solder bump having a desired shape profile for passive height alignment, the method comprising the steps of:
    selecting a liquid solder having a capillary length;
    providing a substrate comprising a gold wetting pad on a silica or silica-based glass de-wetting background on a composite surface of the substrate, the gold wetting pad having a dimension smaller than the capillary length of the liquid solder; and
    vertically dipping the substrate into a liquid solder, wherein the composite surface is perpendicularly immersed pass a horizontal top flat surface of the liquid solder and redrawn in an opposite direction such that the composite surface perpendicularly protrudes from the horizontal top flat surface of the liquid solder for the liquid solder to remain only on the wetting pad as a solder drop having the desired shape profile, wherein the solder drop has a contact angle greater than ninety degrees with respect to the de-wetting background and not adhere to the de-wetting background to form a resultant solder bump with a sufficient bearing effect and the desired shape profile for passive height alignment.

14. The method of claim 13 wherein the step of providing includes printing the gold wetting pad within an area having the dimension of a diameter less than the capillary length of the liquid solder.

15. The method of claim 13 wherein the step of providing includes printing the gold wetting pad within a circle having a diameter less than the capillary length of the liquid solder.

16. The method of claim 13 wherein the step of providing includes printing the gold wetting pad within a circle having a diameter less than 2 mm.

17. The method of claim 13 wherein the step of providing includes printing the gold wetting pad within a square having a side dimension less than or equal to 2 mm.

18. The method of claim 13 wherein the dipping step comprises rapidly moving the composite surface of the substrate in a plane perpendicular to a longitudinal top flat surface of the liquid solder to provide the contact angle greater than ninety degrees.

19. The method of claim 13 wherein the dipping step comprises dipping the substrate into a tin/lead liquid solder.

20. The method of claim 18 wherein the rapidly moving step comprises rapidly lowering and then raising at least partially the composite surface of the substrate in the plane perpendicular to the longitudinal top flat surface of the liquid solder.

* * * * *